United States Patent [19]

Hirai et al.

[11] Patent Number: 4,648,129
[45] Date of Patent: Mar. 3, 1987

[54] FREQUENCY CONVERTER

[75] Inventors: Kenji Hirai, Yokohama; Hideki Torizuka, Kawasakishi, both of Japan

[73] Assignee: Kabushiki Kaisha Toshiba, Japan

[21] Appl. No.: 641,709

[22] Filed: Aug. 17, 1984

[30] Foreign Application Priority Data

Dec. 15, 1983 [JP] Japan .............................. 58-235037

[51] Int. Cl.⁴ .............................. H03J 1/10; H03J 1/26
[52] U.S. Cl. ..................................... 455/317; 455/323
[58] Field of Search ............... 455/317, 323, 325, 330, 455/343

[56] References Cited

U.S. PATENT DOCUMENTS

| 2,789,213 | 4/1957 | Marks et al. | 455/317 |
| 3,493,869 | 2/1970 | Dijkum | 455/317 |
| 3,909,725 | 9/1975 | Baghdady | 455/317 |
| 4,194,158 | 3/1980 | Tanabe et al. | 455/343 |
| 4,449,245 | 5/1984 | Rabe | 455/317 |

OTHER PUBLICATIONS

Kanmuri et al., "Design and Performance of 60-90-GHz Broad-Band Mixer," IEEE Transactions on Microwave Theory and Techniques, pp. 259-261, May 1976.

Primary Examiner—Robert L. Griffin
Assistant Examiner—Curtis Kuntz
Attorney, Agent, or Firm—Finnegan, Henderson, Farabow, Garrett & Dunner

[57] ABSTRACT

A frequency converter includes a mixer, a local oscillator connected to the mixer by a line which transmits a local oscillator signal to the mixer and a starter circuit for supplying a transient bias current to the mixer for insuring the start of the local oscillations.

5 Claims, 6 Drawing Figures

FREQUENCY CONVERTER

BACKGROUND OF THE INVENTION

This invention relates to a frequency converter in which a mixer is connected to a local oscillator without an element therebetween to prevent mutual interference between the mixer and the local oscillator.

DESCRIPTION OF THE PRIOR ART

A frequency converter is a circuit which mixes an input signal of a frequency $f_s$ with a local oscillator (LO) signal of a frequency $f_{LO}$, and converts the input signal into an intermediate frequency (IF) signal which has a frequency of $f_{IF}=|f_s-f_{LO}|$, or $f_{IF}=f_s+f_{LO}$.

The construction of a prior-art frequency converter will now be described with reference to the block diagrams of FIGS. 1(a) and 1(b).

As to FIG. 1(a) an input signal is supplied to a mixer 1 through a terminal RF. An LO port 1a of the mixer 1 is connected through the isolator 2 to an LO 3 which supplies an LO signal to the mixer 1.

In a frequency converter with this construction, however, a voltage reflection coefficient $\Gamma_L$ of the mixer 1 when viewed from the LO port 1a has a relatively large value within the range of $0.2 \lesssim |\Gamma| \lesssim 0.5$. In case the isolator 2 is not connected between the LO port 1a and the LO, the voltage reflection coefficient $\Gamma_L$ fluctuates with the LO excitation amplitude, and the output and frequency of the LO 3 fluctuate with the voltage reflection coefficient $\Gamma_L$. Thus, the mixer 1 and the LO 3 affect each other's characteristics if they are connected together directly. An isolator 2 is connected between the mixer 1 and the LO 3 to eliminate this mutual interference. However, the addition of the isolator 2 increases the size of the circuit.

A frequency converter such as that used in a portable microwave receiver or a direct broadcasting satellite receiver, which must be small and inexpensive, is constructed, as shown in FIG. 1(b), by directly connecting a mixer 4 to an LO 5. In this case, in order to minimize the mutual adverse effects between the mixer and the LO, a transmission line of an electrical length $\theta$ is connected between an LO port 4a and an LO output terminal 5a, and is adjusted so that satisfactory characteristics are obtained.

The characteristics of the LO with respect to load fluctuations are usually depicted in a Rieke diagram. FIG. 2 is an example of a Rieke diagram which shows the relationship between the output characteristics of an LO and load. The center of the polar chart corresponds to the condition $|\Gamma|=0$ (i.e., a matched load), and the circumference corresponds to the condition $|\Gamma_L|=1$ (i.e., a reactive load). Solid curves $P_1$, $P_2$, and $P_3$ are power output contours, and broken curves $f_1$, $f_2$ and $f_3$ are equi-frequency contours.

The oscillation of the LO stops or exhibits undesirable oscillations, such as a mode jump, when it is connected to a load, depending on the conditions of that load. The load conditions leading to such undesirable oscillations are shown (as an example) within the hatched zone 21 of the Rieke diagram of FIG. 2, although they vary according to the characteristics of the LO.

It is preferable that the load zone leading to such undesirable oscillations be as small as possible, but it is difficult to eliminate the load zone described above completely with an LO made of solid-state oscillation elements.

In the construction of FIG. 1(b), therefore, the electrical length $\theta$ of the transmission line is set so that the load conditions are outside the hatched zone 21 of FIG. 2.

Because of the variations in the characteristics of the solid-state oscillation elements used or in the circuit tuning, however, the problem arises that the local oscillation may not start even if the electrical length $\theta$ of the transmission line is critically adjusted.

SUMMARY OF THE INVENTION

An object of this invention is, therefore, to provide a frequency converter which can form a compact and inexpensive frequency conversion unit.

A further object of this invention is to provide a frequency converter which can prevent a local oscillator from causing undesirable oscillations such as a mode jump.

Another object of this invention is to provide a frequency converter in which the local oscillations are started easily.

The above objects are accomplished in the invention by adding a starter circuit to a frequency converter for supplying a transient bias current to a mixer.

DESCRIPTION OF THE PREFERRED EMBODIMENTS

Figure 1A:
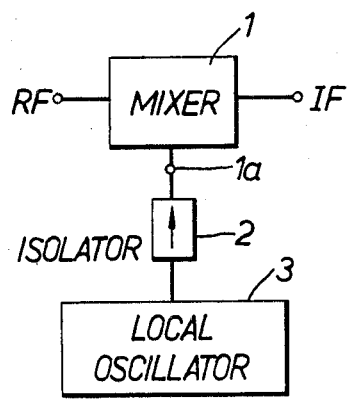
FIGS. 1(a) and (b) are block diagrams of different constructions of prior-art frequency converters.
Figure 1B:
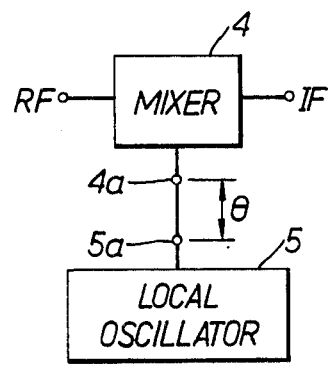
Figure 2:
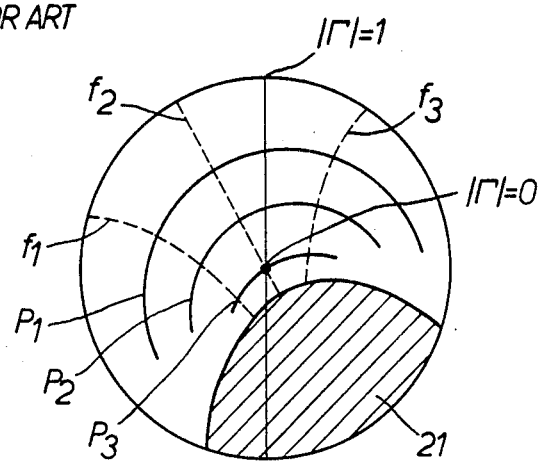
FIG. 2 is a Rieke diagram of the load characteristics of an oscillator.
Figure 3:
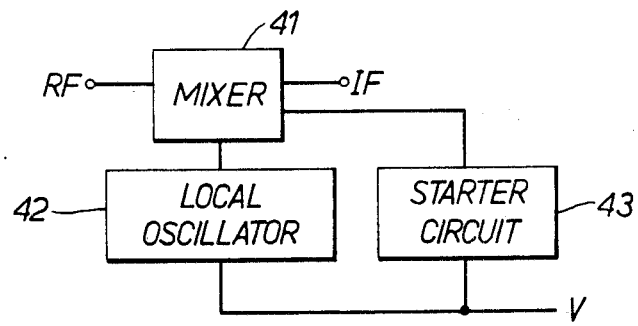
FIG. 3 is a block diagram of the construction of the frequency converter of the present invention.

A basic embodiment of a frequency converter according to the present invention will be described in the following with reference to the block diagram of FIG. 3.

A terminal RF is an input terminal through which a signal is supplied to a mixer 41. An LO signal is generated by an LO 42 and is supplied to the mixer 41 without the use of an isolator or transmission line. The LO 42 is connected to a drive power supply V.

A starter circuit 43 for supplying a bias current to the mixer 41 for a short period of time is connected between the mixer 41 and the drive power supply V. A terminal IF connected to the mixer 41 is the output terminal of an IF signal of the converted frequency.

Figure 4:
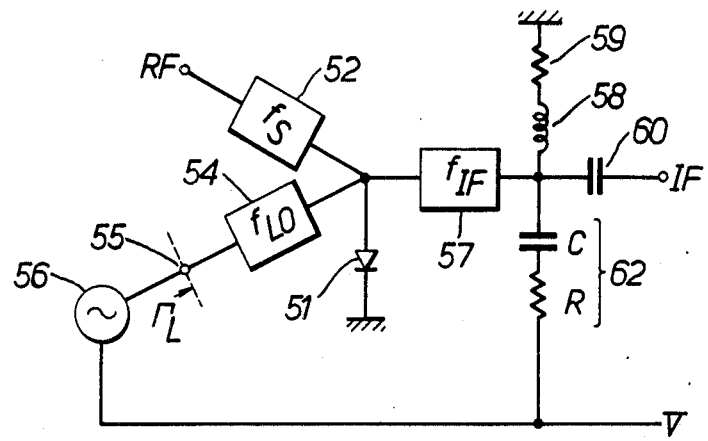
FIG. 4 is a more detailed diagram of the circuit of the embodiment of the frequency converter of FIG. 3.

A specific example of the operation of the frequency converter of this construction will now be described with reference to FIGS. 4 and 5.

A bandpass filter 52 for the input signal through a signal input terminal RF is connected to a mixer diode 51 forming the mixer. The diode 51 is also connected to a bandpass filter 54 for the LO signal and an LO input terminal 55 which is connected directly to an LO 56, and to an IF filter 57 which rejects the input signal and the LO signal and which is connected to ground through an inductance 58 and a resistor 59 for providing DC bias return. The IF filter 57 is also connected to a capacitor 60 for cutting the DC output. A terminal IF connected to the capacitor 60 acts as an IF output terminal. A starter circuit 62 formed of a capacitor C and a resistor R is connected between the IF filter 57 and the drive power supply V which is in common with that for the LO 56.

The operation of the frequency converter when started will now be described with reference to the graph of FIG. 5, in which time t is shown along the abscissa. Reference letters $V_{dc}$, $I_d$ and $|\Gamma_L|$ designate the bias voltage of the starter circuit, the DC current in the mixer diode 51, and the absolute value of the voltage reflection coefficient at the LO port 55 of the mixer, respectively.

If the power supply is turned on at time $t_0$, the LO 56 and the starter circuit 62 are supplied with the voltage. At time $t_0$, the LO 56 is not yet operating so that no excitation power is supplied from the LO 56 to the diode 51. In this state, the absolute value of $|\Gamma_L|$ is almost 1. The bias voltage $V_{dc}$ of the starter circuit starts to rise at time $t_0$ and reaches a steady-state voltage $V_{dc0}$ by time $t_2$. The voltage output from the starter 62 is supplied through the IF filter 57 to the mixer diode 51 so that a transient current $I_{d'}$ flows in the forward direction to the diode 51. The transient current $I_{d'}$ is at a maximum at time $t_1$ between times $t_0$ and $t_2$, in accordance with the characteristics of the resistor R and the capacitor C which together constitute the starter circuit. The absolute value of $|\Gamma_L|$ is gradually reduced during a period of $t_0 < t \leq t_1$ by the current flowing through the diode. This change can be shown in a Rieke diagram, in which the load condition shifts from a non-oscillatory region to an oscillate at time $t_1$.

Figure 5:
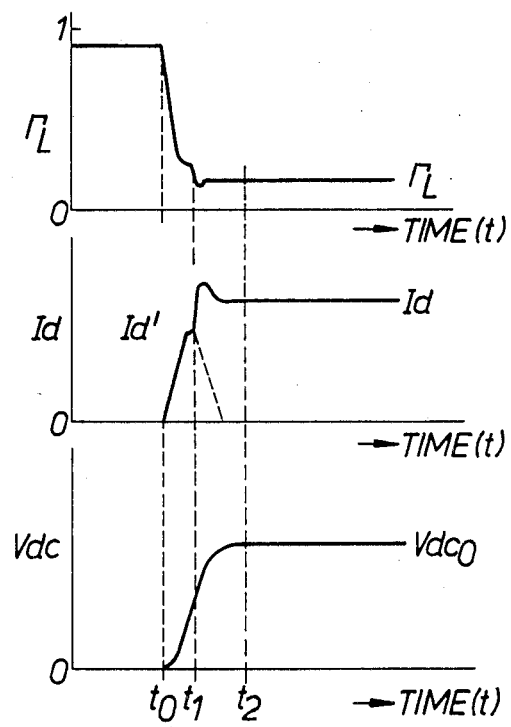
FIG. 5 is a timing chart of the characteristics of various parts of the circuit of FIG. 4, illustrating the starting characteristics thereof.

Once the LO has started, the mixer diode continues to operate normally because it has already been supplied excitation power from the LO, even if the current $I_{d'}$ supplied to the diode by the output voltage of the starter circuit completely disappears at a time $t \approx t_2$, as depicted by the broken line in FIG. 5.

The value of the diode current Id has a peak during a period of $t_1 < t < t_2$. It is caused by the fact that the current supplied by the LO adds to the current from the starter circuit 62. The absolute value of $|\Gamma_L|$ varies depending on the diode current after the time $t_1$.

The load condition is usually able to rapidly leave the non-oscillatory region by the application of the slight current $I_{d'}$, and the value of $I_{d'}$ can be easily set to be a desirable value by adjusting the values of the C and R of the starter circuit 62, and the voltage $V_{dc}$.

In the embodiment thus far described, the description is directed to a case in which a mixer diode is used as the mixer. Similar effects can be obtained if a bias voltage or current is supplied for a short period of time so that the absolute value of $|\Gamma_L|$ of the LO port is small, even in a mixer formed of a dual-gate FET. In the description above, the power supplied both to the LO and the starter circuit is assumed to be turned on at the same time $t_0$. It is, however sufficient that a bias current is supplied to the mixer by the starter circuit for a short period of time when the LO is on.

What is claimed is:

1. A frequency converter for converting an input signal, comprising:
   a mixer receiving the input signal;
   a local oscillator for transmitting a local oscillator signal to said mixer, the input signal being mixed in said mixer with said local oscillator signal, and
   starter means for supplying a transient bias current to said mixer for a predetermined period of time after said local oscillator and said starter means are supplied with a voltage from a drive power source, said bias current changing load conditions of said mixer to insure said local oscillator begins transmitting said local oscillator signal.

2. The frequency converter as defined in claim 1 wherein an intermediate frequency filter is connected between said starter means and said mixer.

3. The frequency converter as defined in claim 1 wherein said starter means includes a capacitor and a resistance connected in series.

4. The frequency converter as defined in claim 1 also including means for supplying a voltage to said local oscillator and said starter means simultaneously.

5. The frequency converter as defined in claim 1 wherein said mixer includes a diode.

* * * * *